(12) United States Patent
Croce et al.

(10) Patent No.: US 6,600,673 B1
(45) Date of Patent: Jul. 29, 2003

(54) COMPILABLE WRITEABLE READ ONLY MEMORY (ROM) BUILT WITH REGISTER ARRAYS

(75) Inventors: Peter F. Croce, Essex Junction, VT (US); Steven M. Eustis, Essex Junction, VT (US); Ronald A. Piro, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/248,599

(22) Filed: Jan. 31, 2003

(51) Int. Cl.[7] ................ G11C 17/12; G06F 17/50
(52) U.S. Cl. ................ 365/104; 365/103; 365/94; 365/189.05
(58) Field of Search .............. 365/78, 103, 104, 365/94, 189.05, 189.12, 230.08; 716/18

(56) References Cited

U.S. PATENT DOCUMENTS

| | | | |
|---|---|---|---|
| 4,128,773 A | 12/1978 | Troutman et al. ...... 365/185.07 |
| 4,175,290 A | 11/1979 | Harari .................. 365/185.07 |
| 4,403,306 A | 9/1983 | Tokushige et al. .......... 365/156 |
| 5,040,143 A | 8/1991 | Matsumura et al. .......... 365/51 |
| 5,377,136 A | 12/1994 | Nishio et al. ................. 365/63 |
| 5,406,516 A | 4/1995 | Ihara et al. ............ 365/189.01 |
| 5,418,739 A | 5/1995 | Takasugi .................... 365/149 |
| 5,432,742 A | 7/1995 | Ihara et al. ............ 365/189.01 |
| 5,455,788 A | 10/1995 | Clark ........................ 365/156 |
| 5,550,782 A | 8/1996 | Cliff et al. ............. 365/230.03 |
| 5,753,946 A | * 5/1998 | Naiki et al. ................. 257/295 |
| 5,777,925 A | 7/1998 | Tokushige ............. 365/185.11 |
| 5,903,490 A | 5/1999 | Rotem et al. .................. 365/63 |
| 5,923,582 A | 7/1999 | Voss ........................... 365/154 |
| 5,953,245 A | 9/1999 | Nishimura ................... 365/145 |
| 5,963,475 A | 10/1999 | Choi et al. ............. 365/185.11 |
| 6,115,019 A | * 9/2000 | Perner ......................... 345/98 |
| 6,212,091 B1 | * 4/2001 | Kawabata et al. ........... 365/63 |
| 6,246,629 B1 | 6/2001 | Watanabe et al. ...... 365/230.03 |
| 6,307,775 B1 | 10/2001 | Forbes et al. .......... 365/185.01 |

* cited by examiner

Primary Examiner—Andrew Q. Tran
(74) Attorney, Agent, or Firm—McGinn & Gibb, PLLC; Richard A. Henkler, Esq.

(57) ABSTRACT

A method and structure for a pair of read only memory (ROM) cells having a first latch and a second latch connected to the first latch. The first latch and the second latch behave as master and slave latches to one another. The first latch and the second latch include a write bitline connection that is permanently connected to a fixed voltage source to permanently program the first latch and the second latch to permanent ROM values.

20 Claims, 9 Drawing Sheets

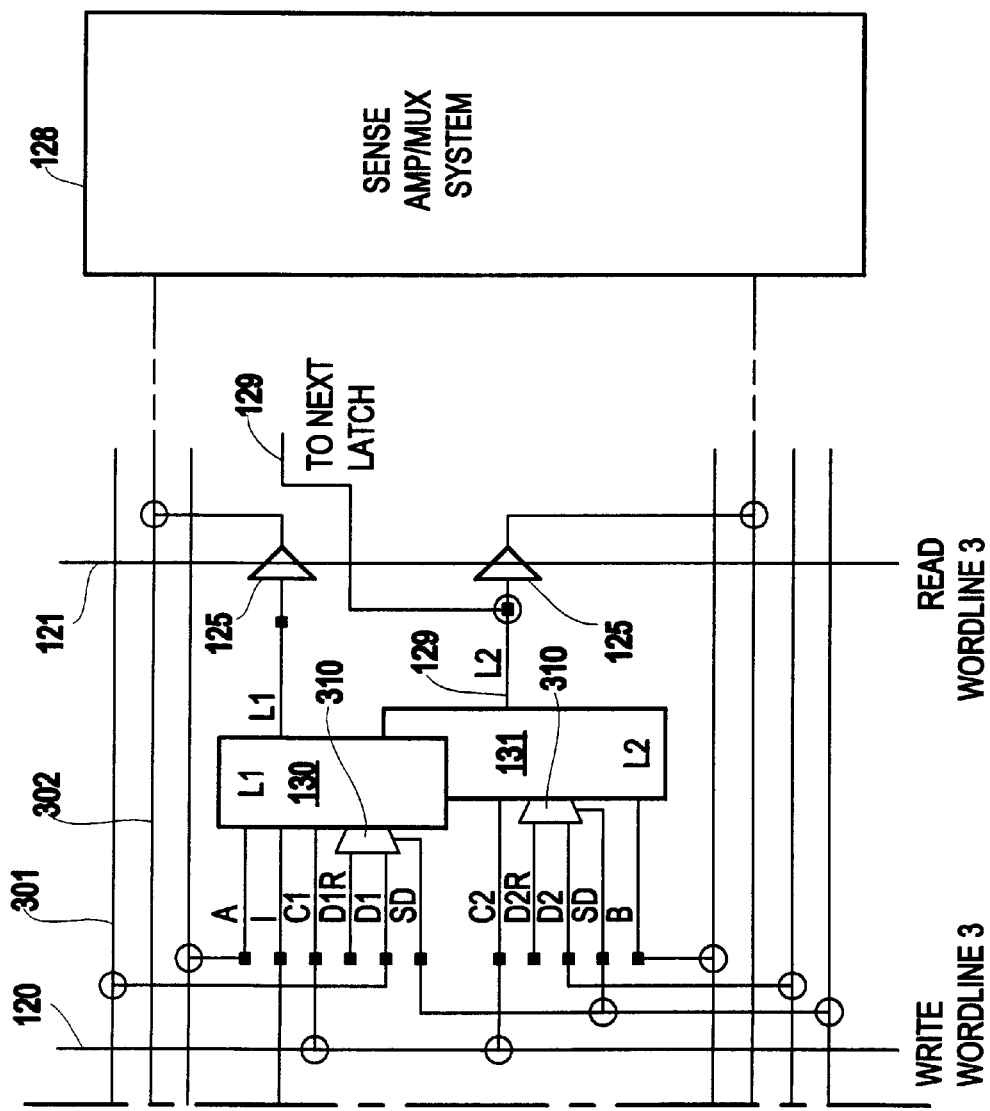

COMPILABLE WRITEABLE READ ONLY MEMORY (ROM) BUILT WITH REGISTER ARRAYS

BACKGROUND OF INVENTION

1. Field of the Invention

The present invention generally relates to read only memories (ROMs) and more particularly to using latches in register arrays as ROM cells for very small ROMs, where the ROMs are also selectively writeable.

2. Description of the Related Art

Conventional read only memories (ROMs) are formed using memory cells (such as transistors) permanently programmed using fuses or structural electrical connections. In addition, such ROM structures include built-in it self test (BIST) devices that are used to locate defective memory cells. The BIST devices have a minimum fixed size. For large memory arrays these BIST devices occupy a very small percentage (less than 5 percent) of the overall area of the ROM structure. However, if a very small ROM array (e.g., less than 2000 memory cells) were to be made, the BIST devices and peripheral support features could comprise a large percentage (more than 50%) of the total area. Therefore, there is a need to create a ROM array that does not require such BIST.

The invention described below provides a method and structure for forming ROMs smaller than a given threshold that do not require BIST or similar features by using non-conventional devices as memory cells and, in doing so, provides a ROM that is writeable.

SUMMARY OF INVENTION

The invention provides a pair of read only memory (ROM) cells having a first latch and a second latch. The first latch and the second latch are master and slave latches to one another. The first latch and the second latch include a write bitline connection that is permanently connected to a fixed voltage source (e.g., ground (0) or VDD (1)) to program the first latch and the second latch to permanent ROM values.

The first latch and the second latch further include read wordline connections, write wordline connections, read bitline connections and have a tri-state driver that has the read wordline connections and the read bitline connections. The read wordline connections are connected to a read wordline. The write wordline connections are connected to a write wordline. The read bitline connections are connected to read bitlines.

During read operations, the read bitlines are used to read the permanent ROM values. During initialization operations, the write wordlines are held active on all rows, to force the first latch and the second latch to the permanent ROM values. During test operations, after the initialization, data within the first latch or the second latch is scanned out. After a subsequent initialization, data in the other latch is scanned out.

The invention also provides a method for designing a read only memory (ROM) structure. The method entails inputting the number of ROM cells to be included in the structure. Next, the invention utilizes latches within a register array as the ROM cells if the number of ROM cells is below a threshold. The invention alters the design of the register array to permanently connect write bitline connections of the latches in the register array to ground or a voltage source to permanently program the latches. The altering of the design is such that, during initialization operations, write wordlines in the register array are held active on all rows, to force the latches to permanent ROM values. The invention also tests the design during test operations without a BIST. After the initialization, data within one latch of a pair of master/slave latches is scanned out and, after a subsequent initialization, the other latch of the pair is scanned out.

The invention provides a ROM array by modifying the register array (RA) of master/slave latches to permanently connect the write bitline connection to either ground or a set voltage value (VDD). By utilizing the register array with master/slave latches, the testing of the ROM array can be performed by a scan out operation, thereby eliminating the need for BIST. As noted above, it becomes impractical to design a conventional ROM array below a certain size because the relatively fixed size of the BIST devices becomes a larger and larger percentage of the overall device size, as the size of the array is decreased. To the contrary, with the inventive structure, the ROM array can be made as small as necessary, without incurring the area penalty associated with the relatively fixed size of the BIST, because the inventive structure performs testing using a scan out operation and avoids any such BIST structures.

BRIEF DESCRIPTION OF DRAWINGS

The invention will be better understood from the following detailed description of embodiments of the invention with reference to the drawings, in which:

FIGS. 3A–3C are schematic diagrams of a ROM structure of latches according to the invention;

DETAILED DESCRIPTION

Figure 1A:
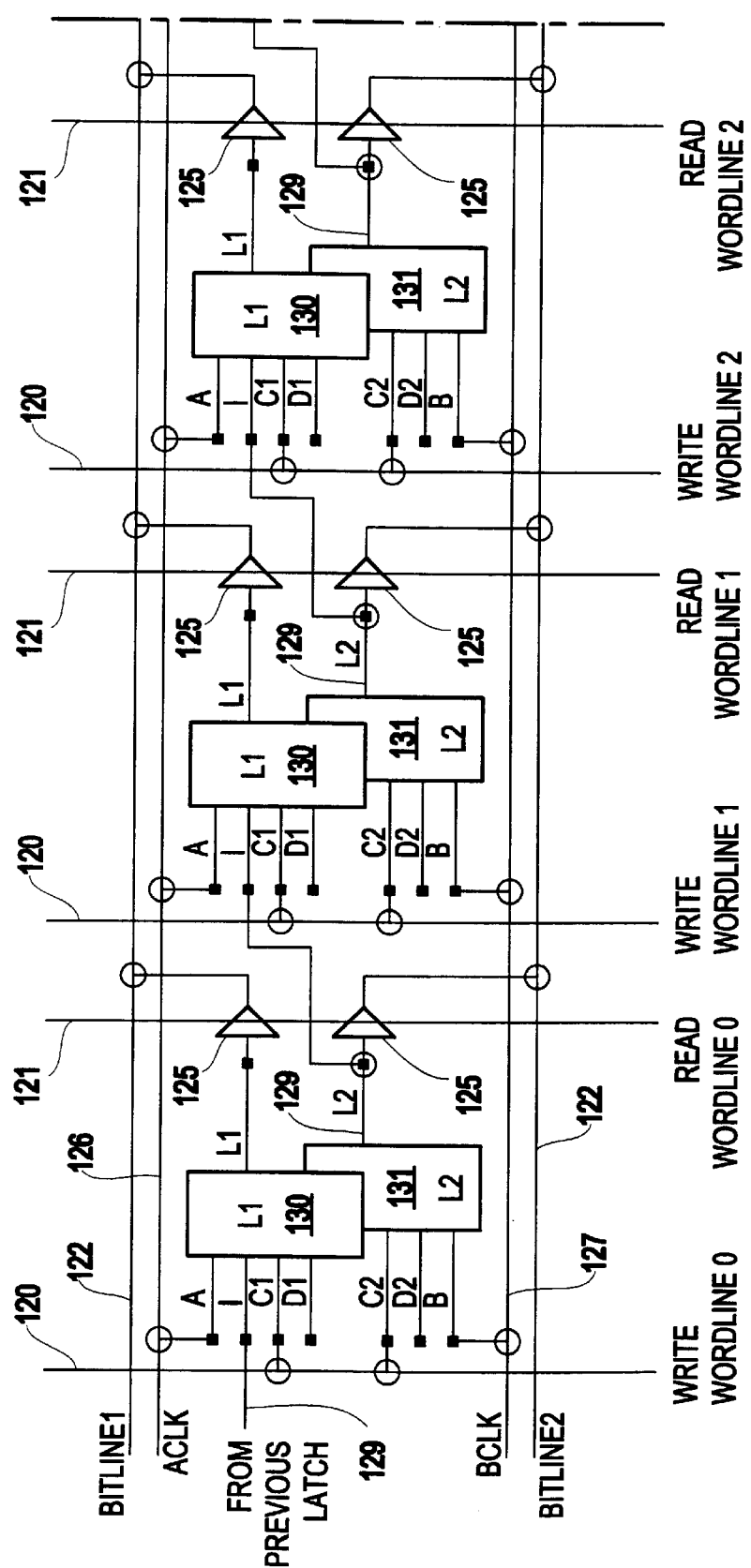
FIGS. 1A–1C are schematic diagrams of a ROM structure of latches according to the invention.

The invention provides a ROM array by modifying the register array (RA) of master/slave latches to permanently connect the write bitline connection to either ground or a set voltage value (VDD). By utilizing the register array with master/slave latches, the testing of the ROM array can be performed by a scan out operation, thereby eliminating the need for BIST. As noted above, it becomes impractical to design a conventional ROM array below a certain size because the relatively fixed size of the BIST devices becomes a larger and larger percentage of the overall device size, as the size of the array is decreased. To the contrary, with the inventive structure, the ROM array can be made as small as necessary, without incurring the area penalty associated with the relatively fixed size of the BIST, because the inventive structure performs testing using a scan out operation and avoids any such BIST structures.

More specifically, as shown in FIGS. 1A–1C and 2, the invention includes a register array (RA) of read only memory (ROM) cells (e.g., RAROM bits) comprising pairs of cells. Each pair of cells includes a first latch 130 (L1) and a second latch 131 (L2) connected to the first latch 130. The first latch 130 and the second latch 131 comprise master and slave latches to one another (and, therefore, can be tested using a scan out operation). The first latch 130 and the second latch 131 include a write bitline connection D1, D2 that is permanently connected (e.g., by wiring design or permanent fuse connection) to a fixed voltage source which can be ground or a voltage level (VDD) to permanently program the latches to permanent ROM values.

Lines 120 (RWL) and 121 (WWL) represent the various write wordlines and read wordlines. The write wordline signals are shown as inputs C1, C2 to the latches 130, 131. The clock signals are shown as items 126, 127 and supply the "A" and "B" clock signals to the latches 130, 131. The signals (1) which proceed from the previous latch and flow to the next latch are shown as lines 129. Tristate drivers 125 (connected to the latch outputs L1, L2 and to the read wordlines 121) operate to allow the value within the associated latch to be read only when the associated read wordline 121 is activated. The conventional sense amplifier/multiplexor system is shown as item 128.

Figure 1C:
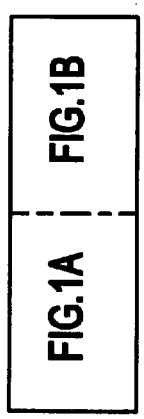
Figure 1B:
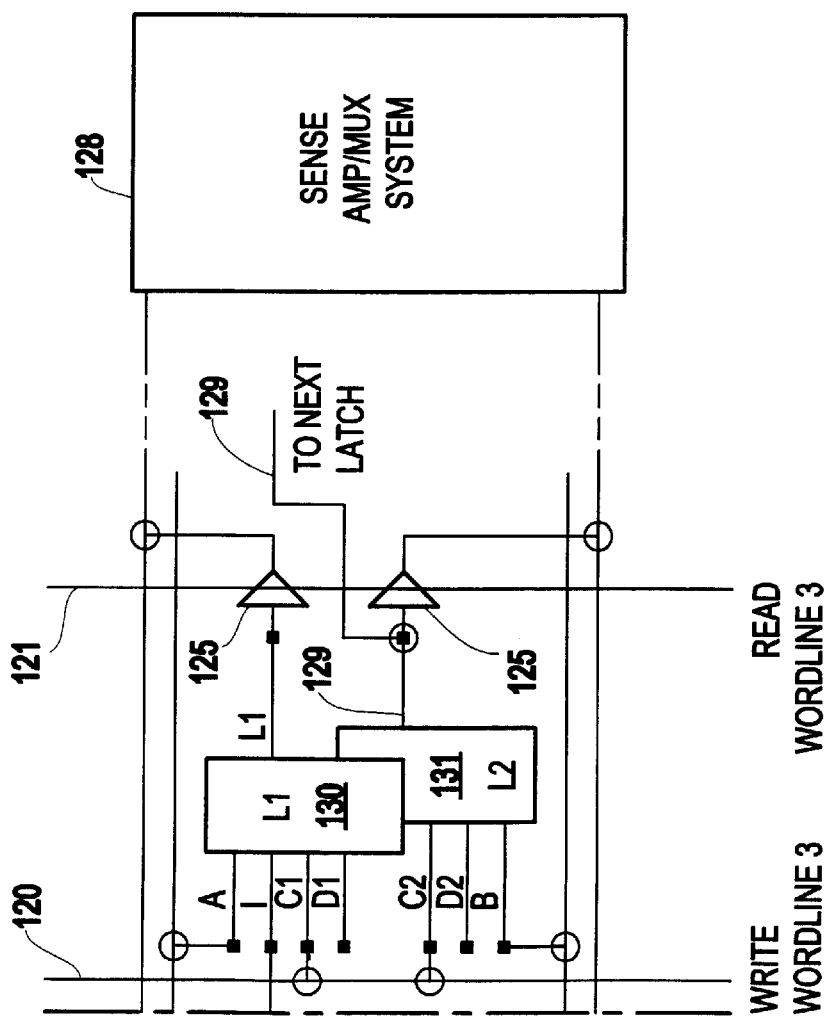
Figure 2:
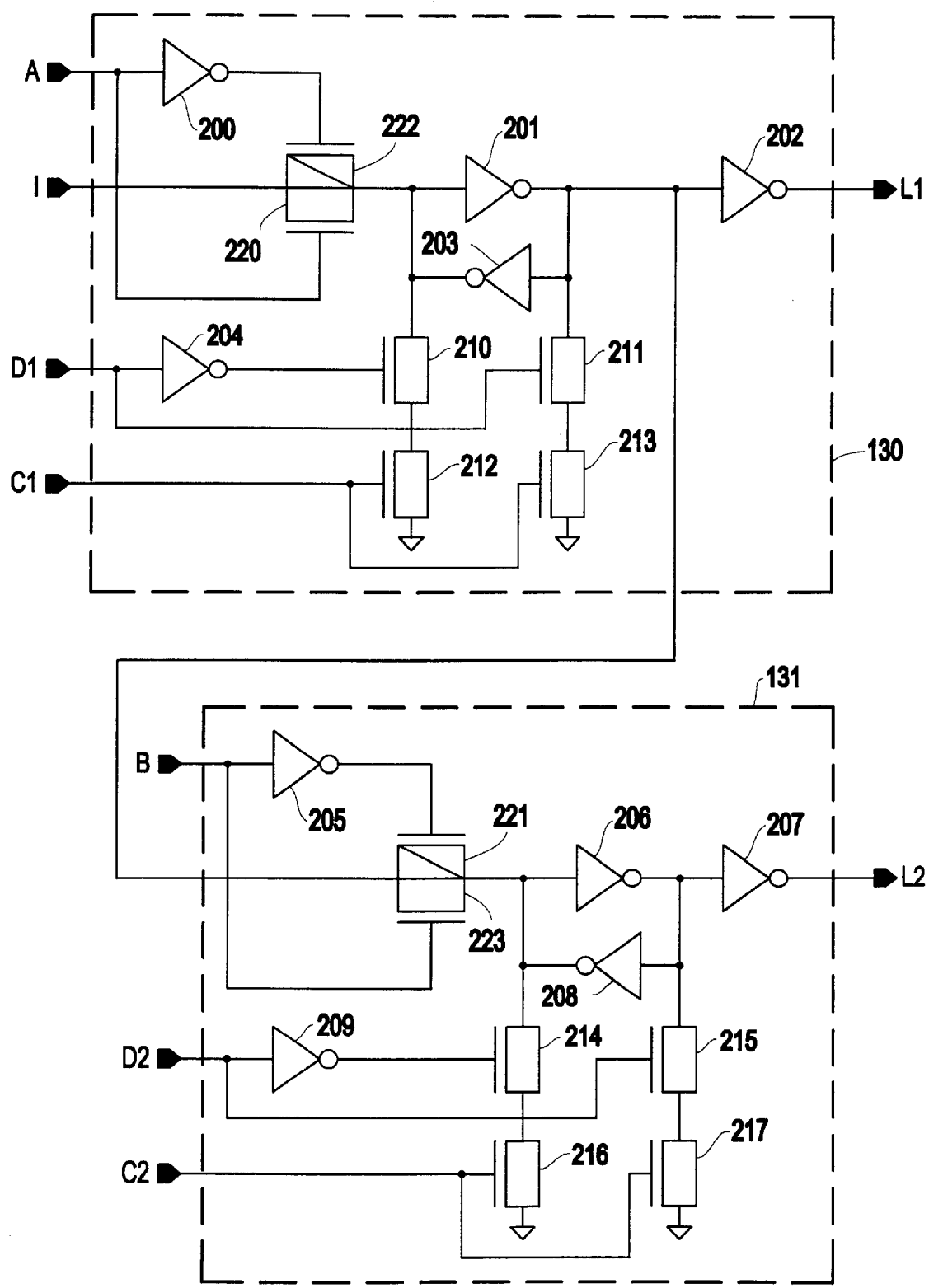
FIG. 2 is a schematic diagram of latch structures according to the invention.
Figure 3A:
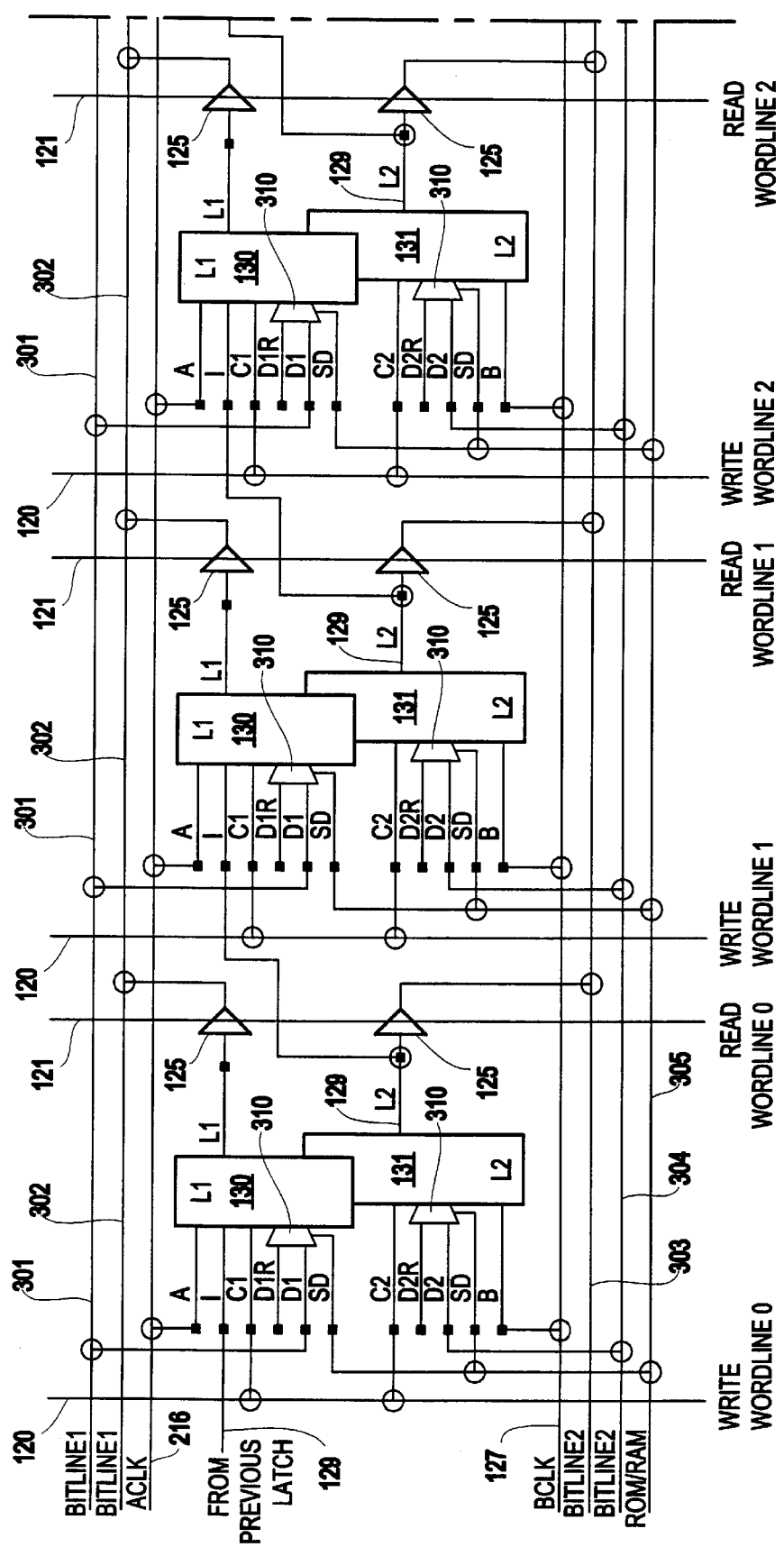
Figure 5A:
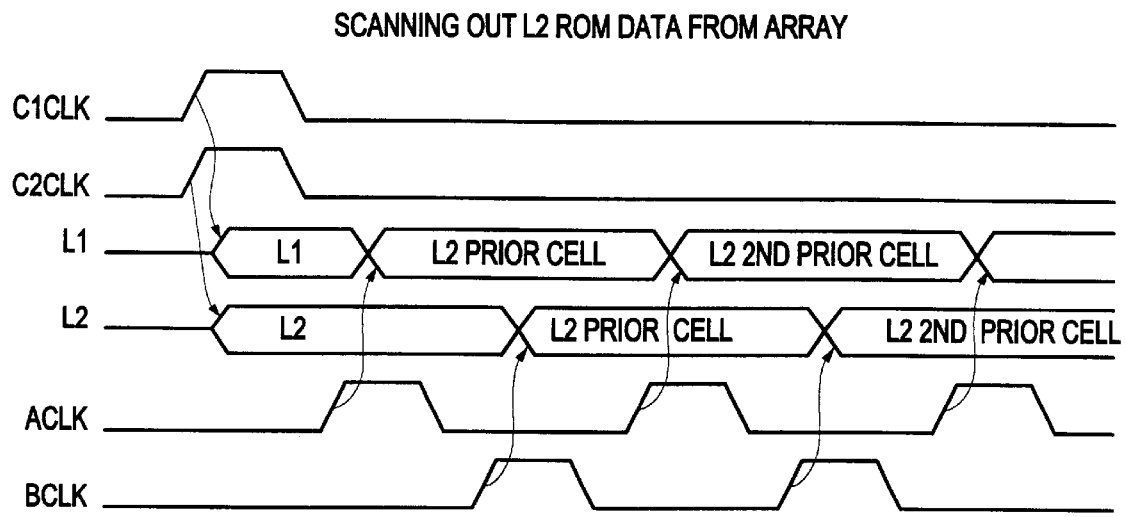
FIGS. 5A and 5B are waveform diagrams of signals processed by the inventive structure.
Figure 5B:
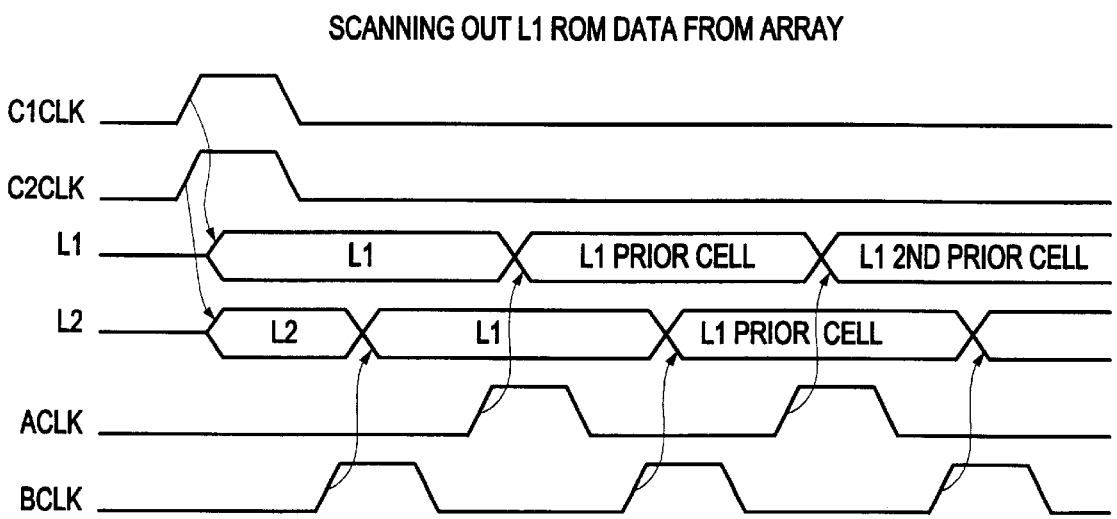

FIG. 2 illustrates a more detailed schematic diagram of the latches 130, 131 shown in FIGS. 1A–1C. More specifically, the latches include inverters 200–209, transistors 210–217, and passgate transistors 220–223. ROM data is written into latches 201/203 and 206/208 from signals D1 and D2 by holding signals C1 and C2 at VDD. C1 turns on transistors 212 and 213, and the data on input D1 flows through inverter 204 and transistors 210 and 211 to set the latch 201/203 and is observed through the L1 output. Similarly C2 turns on transistors 216 and 217, and the data on input D2 flows through inverter 209 and transistors 214 and 215 to set the latch 206/208 and is observed through output L2. After C1 and C2 return to their normal ground state, the values will be held in the latches. During a scan operation during test, A and B clocks are alternately held high in a non-overlapping fashion. When A is high, the data on the input flows through passgate transistors 220/222 into latch 201/203. When B is high, data from latch 201/203 flows through passgate transistors 221/223 into latch 206/208. By alternating A and B clocks, the entire ROM memory becomes a large serial shift register and the memory bits can be read out for verification one at a time. Because the scan operation treats the L1/L2 latch as one memory cell (master-slave) the memory contents need to be scanned out twice—once for the L1 bits (by starting with B clock) and once for the L2 bits (by starting with the A clock). FIGS. 5A and 5B, described below, illustrate details on scanning out the ROM data.

As mentioned above, with the inventive register array structure, there is no write bitline. Instead, this embodiment of the invention only includes read bitlines 122. Rather than being connected to write bitlines, connections D1 and D2 are either grounded or connected to a preset voltage. During initialization, the write wordlines 120 are turned on to allow each of the latches 130, 131 to attain the value determined by their D1, D2 connection (ground (0) or VDD (1)), which as mentioned above, is to either ground or VDD. Thereafter, during each appropriate intersection of the read wordline 121 and the read bitline 122, the values within the latches can be read out.

The latch structure shown above is somewhat similar to a conventional register array; however, the write bitlines have been removed, and the bitline nodes D1, D2 in the cell have been personalized to a 1 or 0 at the time of manufacture with metal personalization shapes. The personalization shapes program each bit to a 1 or 0 according to a personalization file that the customer provides. During functional operation, the write wordlines 120 are held active on all rows, so all register array latches are forced to the ROM values. Reads are performed with the read wordlines in the conventional manner.

During test operations, the write wordlines are turned off, to allow values to be scanned through the RAROM bits. To test the ROM states, write wordlines are strobed on to load the latches, then turned off, to allow their states to be scanned out. Because the register array is constructed as an L1/L2 array, with one bit being the L1, and the next the L2, two scan operations are required to read all of the bits. On the first read operation, the B-CLK would be strobed first after the write wordline strobe, to preserve the state of the L1s. On the second, the A-CLK would be strobed first to preserve the L2s.

The embodiment shown in FIGS. 3A–3C and 4 uses a register array that has two write ports (e.g., D1R, D1; and D2R, D2). One of the ports (D1R, D2R) has the ROM value hard coded and the other (D1, D2) is used to write as in a conventional register array. A selection is made between the two ports using a multiplexor 310 or similar device. This is essentially a static random access memory (SRAM) with an initialization (however, note that no BIST is necessary). The array is initialized to the ROM value and could be reset to that value any time during operation.

Figure 4:
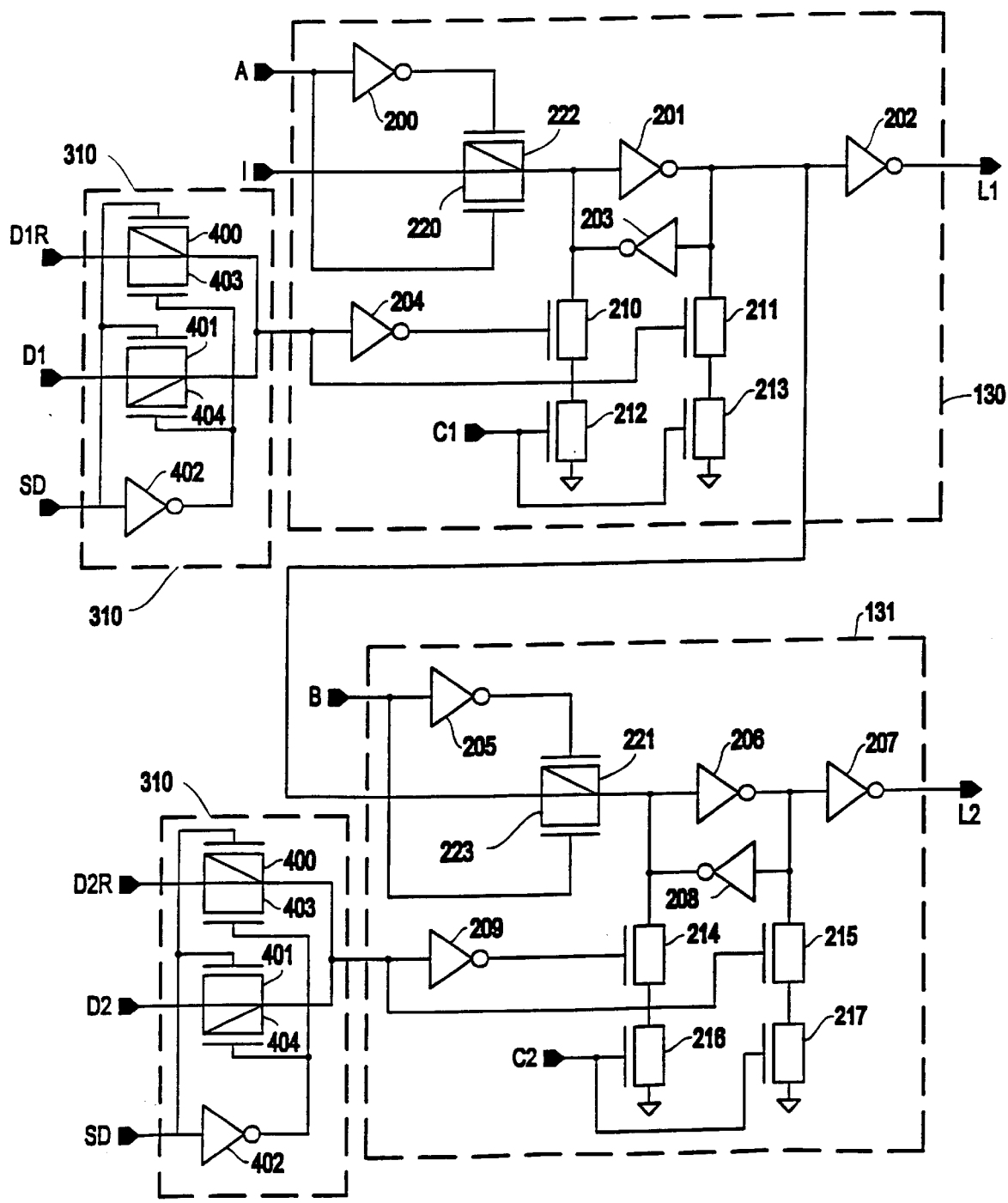
FIG. 4 is a schematic diagram of latch structures according to the invention.

Thus, the structures shown in FIGS. 3A–3C and 4 are similar to the structure shown in FIGS. 1A–1C and 2 except that the embodiment shown in FIGS. 3A–3C and 4 includes write bitlines 301, 304 that are input to the multiplexor 310 as inputs D1, D2. In this embodiment, the permanent connection to ground or VDD is shown as inputs D1R, D2R. The line for controlling the multiplexor 310 is shown as line 305 (and represented as input SD). As shown in FIG. 4, the multiplexors 310 include passgate transistors 400, 401, 403, 404 and an inverter 402. When SD is ground, passgate transistors 400/403 are turned on and D1R and D2R values flow through the multiplexor to its output. When SD is VDD, passgate transistors 401/404 are turned on and D1 and D2 values flow through the multiplexor to its output.

The embodiment shown in FIGS. 3A–3C and 4 can, therefore, be used as either a ROM or a RAM device depending upon the input to the multiplexor 310. If the multiplexor 310 selects input D1R or D2R, the device operates as a ROM, as described above. To the contrary, if the multiplexor 310 selects input D1 or D2, the device acts as a conventional latch register array, allowing the write bitline to write volatile data to the latches.

FIGS. 5A and 5B present the signal waveforms resulting from scanning out the first latch and the second latch, respectively. More specifically, it can be seen why two scans are needed to read all of the memory data. More specifically, from a scanning standpoint, the L1/L2 master/slave latch is one memory element, not two, as it when used as a ROM or SRAM. When either the ACLK or BCLK are first brought to VDD, one of the two memory latches gets over-written. FIG. 5A illustrates how all the L2 data of the array can be read out, by first bringing ACLK high and then alternating ACLKs and BCLKs in a non-overlapping fashion. FIG. 5B illustrates how all of the L1 data of the array can be read out, by first bringing BCLK high and then alternating ACLKs and BCLKs in a non-overlapping fashion. It is critical that in both cases that the ACLK and BCLK signals do not overlap (are never at VDD at the same time) or otherwise data will flush through the entire array and all the data will be lost.

Figure 6:
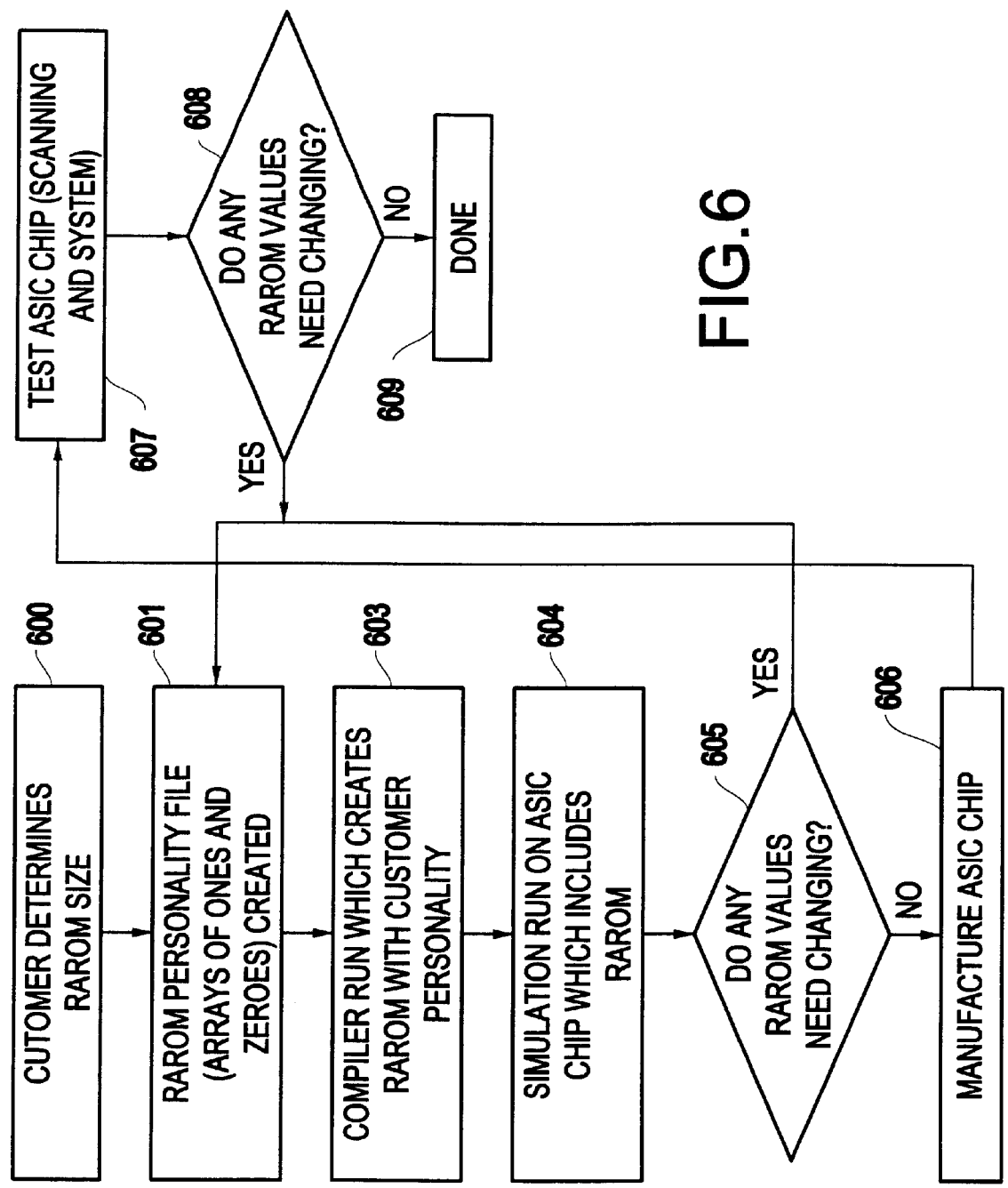
FIG. 6 is a flowchart showing an embodiment of the invention.
Figure 7:
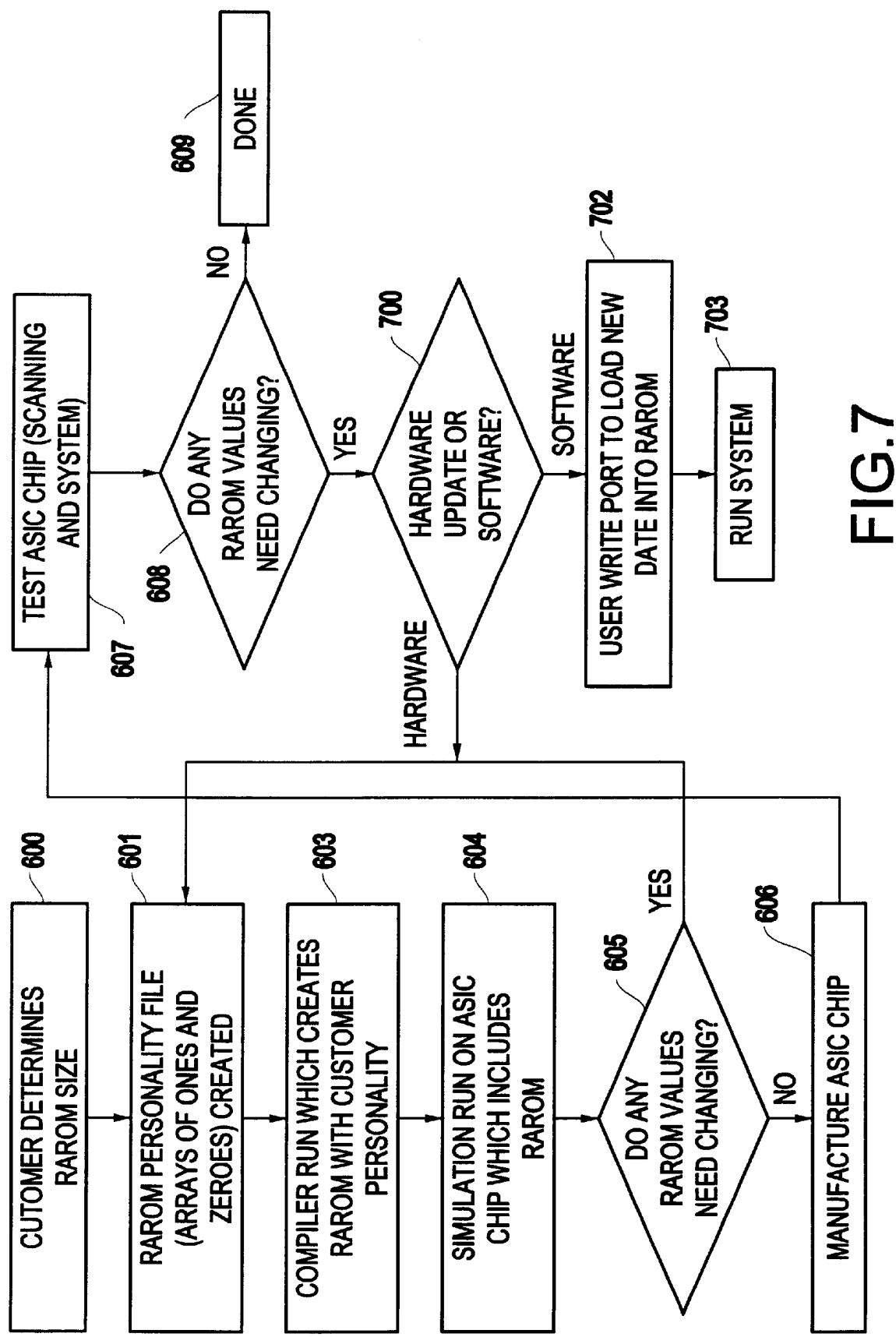
FIG. 7 is a flowchart showing an embodiment of the invention.

FIGS. 6 and 7 are flowcharts that illustrate the processing the invention uses to arrive at the inventive structure. More specifically, in item 600, the customer determines the size of the device to be created. In addition, the customer provides the pattern of ROM data (in a personality file containing zeros and ones) that the device should permanently produce, as shown in item 601. In item 603, a compiler creates the actual design of the device according to the personality file shown in item 601. In item 604, the invention simulates the application specific integrated circuit (ASIC) that will be designed based upon the compilation in item 603.

In item 605, the invention checks the operation of the ASIC simulated in item 604 and returns to item 601 if any aspects of the device do not operate properly (e.g., do not match the personality file). If the simulated device operates acceptably, the device is manufactured in item 606 and tested in item 607. Once again, if this testing determines that the device does not act in accordance with the personality file provided by the client, processing again returns to item 601. If testing is acceptable, the processing ends at the item 609.

FIG. 7 illustrates a substantially similar process, however, at the end, item 700 determines whether the corrections needed to the device should be made in hardware or software. If the correction should be made in hardware, processing again returns to item 601, as shown above. Sometimes the chip design will be fixed for a design error in another unrelated circuit to the ROM and thus the ROM can be fixed in hardware without the expense of making a new mask for its fix alone. Manufacturing volume could also warrant a ROM-only hardware fix. Typically, if the only design error was a few incorrect ROM bits, it would be too costly to generate new hardware with a new mask. In this situation, a software solution can save significant money. If the correction is to be made in software, processing proceeds to item 702 where data is loaded into the device using the write port. Next, the system is run in item 703 and processing returns back to item 608 determine whether any of the values need to be changed. Due to the input mux complexity, a RAROM that can be written uses a larger physical area than its standard RAROM counterpart. For this reason, a writeable RAROM might be chosen only if the ROM values are anticipated to be changing or are not finalized before manufacturing begins. Additionally, the software needs to be able to control the RAROM and write the new data. This added flexibility is worth the extra costs in area and complexity to some customers.

Thus, as shown above, the inventive structure is scanable and thus does not need a BIST device. Because a BIST device is not needed, the invention is smaller than the normal SRAM array (converted to ROM), DRAM array (converted to ROM) or a normal ROM array with its attached BIST.

With the inventive structure, the entire memory is hooked together in serial and can be read out as one big string of ones and zeros during test for off chip comparison (two scans needed to get all the bits, first even and then odd, as explained above). During functional memory mode the invention functions as a normal ROM.

Another feature of the invention is that the memory is built and programmed with a compiler. Therefore, the customer submits a file of ones and zeros representing the memory bits and the compiler builds the array to the proper size and programs the ones and zeros with the appropriate mask level(s). The same personality file/format (that tells where the ones and zeros go) can be used to make and test the invention and can be used by both RAROMs and normal ROMs.

The invention is also fundamentally different than a conventional gate array. A gate array is a generic physical layout that can be converted (using BEOL processing) to become various logic functions or memory. The invention relates to a standard, stand alone, embedded memory macro within the application specific integrated circuit (ASIC) chip. The inventive memory is self contained and not intermixed with logic as is sometimes found in gate arrays.

Thus, as shown above, the invention provides a ROM array by modifying a register array of master/slave latches to permanently connect the write bitline connection to either ground or a set voltage value VDD. By utilizing the register array with master/slave latches, the testing of the ROM array can be performed by a scan out operation, thereby eliminating the need for BIST. With the inventive structure, the ROM array can be made as small as necessary, without incurring the area penalty associated with the relatively fixed size of the BIST, because the inventive structure performs testing using a scan out operation and avoids any such BIST structures.

While the invention has been described in terms of preferred embodiments, those skilled in the art will recognize that the invention can be practiced with modification within the spirit and scope of the appended claims.

What is claimed is:

1. A pair of read only memory (ROM) cells comprising:
a first latch; and
a second latch connected to said first latch, wherein said first latch and said second latch comprise master and slave latches to one another,
wherein said first latch and said second latch include a write bitline connection that is permanently connected to a fixed voltage source to permanently program said first latch and said second latch to permanent ROM values.

2. The pair of ROM cells in claim 1, wherein said first latch and said second latch further include read wordline connections, write wordline connections, and read bitline connections.

3. The pair of ROM cells in claim 2, further comprising a tri-state driver comprising said read wordline connections and said read bitline connections.

4. The pair of ROM cells in claim 2, wherein said read wordline connections are connected to a read wordline, said write wordline connections are connected to a write wordline, and said read bitline connections are connected to read bitlines.

5. The pair of ROM cells in claim 4, wherein during read operations, said read bitlines are used to read said permanent ROM values.

6. The pair of ROM cells in claim 4, wherein during initialization operations, said write wordlines are held active on all rows, to force said first latch and said second latch to said permanent ROM values.

7. The pair of ROM cells in claim 6, wherein during test operations, after said initialization, data within one of said first latch and said second latch is scanned out and, after a subsequent initialization, data in the other of said first latch and said second latch is scanned out.

8. A pair of read only memory (ROM) cells comprising:
a first latch; and
a second latch connected to said first latch, wherein said first latch and said second latch comprise master and slave latches to one another,
wherein said first latch and said second latch include a write bitline connection that is connected to one of:

a fixed voltage source to permanently program said first latch and said second latch to permanent ROM values; and a write bitline.

9. The pair of ROM cells in claim 8, further comprising a multiplexor for selecting between said write bitline and said fixed voltage source.

10. The pair of ROM cells in claim 8, wherein said first latch and said second latch further include read wordline connections, write wordline connections, and read bitline connections.

11. The pair of ROM cells in claim 10, further comprising a tri-state driver comprising said read wordline connections and said read bitline connections.

12. The pair of ROM cells in claim 10, wherein said read wordline connections are connected to a read wordline, said write wordline connections are connected to a write wordline, and said read bitline connections are connected to read bitlines.

13. The pair of ROM cells in claim 12, wherein during read operations, said read bitlines are used to read said permanent ROM values.

14. The pair of ROM cells in claim 12, wherein during initialization operations, said write wordlines are held active on all rows, to force said first latch and said second latch to said permanent ROM values.

15. The pair of ROM cells in claim 14, wherein during test operations, after said initialization, data within one of said first latch and said second latch is scanned out and, after a subsequent initialization, data in the other of said first latch and said second latch is scanned out.

16. The pair of ROM cells in claim 8, wherein said first latch includes a connection to a first clock signal and said second latch includes a connection to a second clock signal, wherein said first latch takes said second clock signal as a slave latch from said second latch acting as a master latch, and wherein said second latch takes said first clock signal as a slave latch from said first latch acting as a master latch.

17. A method of designing a read only memory (ROM) structure, said method comprising:

inputting the number of ROM devices to be included in said structure;

utilizing latches within a register array as said ROM devices if said number of ROM devices is below a threshold; and altering the design of said register array to permanently connect write bitline connections of said latches in said register array to a ground voltage or a voltage source to permanently program said latches via a software compiler.

18. The method in claim 17, wherein said altering of said design is such that, during initialization operations, write wordlines in said register array are held active on all rows, to force said latches to permanent ROM values.

19. The method in claim 18, further comprising testing said design, wherein during testing operations, after said initialization, data within one latch of a pair of master/slave latches is scanned out and, after a subsequent initialization, the other latch of the pair is scanned out.

20. A register array of read only memory (ROM) cells comprising pairs of cells, each pair of cells comprising:

a first latch; and a second latch connected to said first latch, wherein said first latch and said second latch comprise master and slave latches to one another, wherein said first latch and said second latch include a write bitline connection that is permanently connected to a fixed voltage source to permanently program said first latch and said second latch to permanent ROM values.

* * * * *